United States Patent
Abe et al.

(10) Patent No.: US 9,117,931 B2
(45) Date of Patent: Aug. 25, 2015

(54) SEMICONDUCTOR DEVICE WITH A RESONATOR USING ACOUSTIC STANDING WAVE EXCITED IN SEMICONDUCTOR CRYSTAL

(71) Applicants: Kazuhide Abe, Kanagawa (JP); Atsuko Iida, Kanagawa (JP); Kazuhiko Itaya, Kanagawa (JP); Junji Wadatsumi, Tokyo (JP); Shouhei Kousai, Kanagawa (JP)

(72) Inventors: Kazuhide Abe, Kanagawa (JP); Atsuko Iida, Kanagawa (JP); Kazuhiko Itaya, Kanagawa (JP); Junji Wadatsumi, Tokyo (JP); Shouhei Kousai, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/685,859

(22) Filed: Nov. 27, 2012

(65) Prior Publication Data

US 2013/0256660 A1  Oct. 3, 2013

(30) Foreign Application Priority Data

Mar. 29, 2012  (JP) .................................. 2012-078261

(51) Int. Cl.
*H01L 29/84* (2006.01)
*H03H 9/24* (2006.01)
*H03H 9/02* (2006.01)

(52) U.S. Cl.
CPC ............. *H01L 29/84* (2013.01); *H03H 9/2405* (2013.01); *H01L 2924/1461* (2013.01); *H03H 2009/02314* (2013.01)

(58) Field of Classification Search
CPC ............................................... H01L 2924/1461
USPC .............................................. 257/48; 331/176
See application file for complete search history.

(56) References Cited

U.S. PATENT DOCUMENTS 4,358,745 A  11/1982  Keyes
7,656,243 B2  2/2010  McCorquodale et al.
(Continued)

FOREIGN PATENT DOCUMENTS

JP  57-162513 A  10/1982
JP  2008-66799 A  3/2008
(Continued)

OTHER PUBLICATIONS

Gabriel Weinreich. "Acoustodynamic Effects in Semiconductors", Physical Review vol. 104, No. 2, Oct. 15, 1956, pp. 321-324.
(Continued)

*Primary Examiner* — Thao X Le
*Assistant Examiner* — Geoffrey Ida
(74) *Attorney, Agent, or Firm* — Oblon, McClelland, Maier & Neustadt, L.L.P.

(57) ABSTRACT

A semiconductor device according to an embodiment has: a semiconductor substrate; an acoustic resonator formed on the semiconductor substrate, having a semiconductor layer including impurity electrically isolated from the substrate by depletion layer and configured to resonate at a predetermined resonance frequency based on acoustic standing wave excited in the semiconductor layer; a temperature detector formed on the semiconductor substrate and configured to detect temperature of the semiconductor substrate; a calculating unit formed on the semiconductor substrate and configured to perform calculation of temperature compensation based on the temperature detected by the temperature detector, kind of the impurity and concentration of the impurity; and a controller formed on the semiconductor substrate and configured to control the resonance frequency based on a result of the calculation by the calculating unit.

17 Claims, 6 Drawing Sheets

(56) References Cited

U.S. PATENT DOCUMENTS

| | | | |
|---|---|---|---|
| 2002/0125537 A1* | 9/2002 | Wong et al. | 257/368 |
| 2007/0290764 A1* | 12/2007 | Partridge et al. | 331/176 |
| 2008/0042767 A1* | 2/2008 | Sutardja | 331/176 |
| 2010/0289331 A1* | 11/2010 | Shionoiri et al. | 307/9.1 |
| 2011/0074517 A1* | 3/2011 | McCraith et al. | 331/158 |
| 2011/0220974 A1 | 9/2011 | Abe et al. | |
| 2011/0279201 A1* | 11/2011 | Pensala et al. | 333/219.1 |
| 2012/0241877 A1 | 9/2012 | Abe et al. | |
| 2013/0099629 A1* | 4/2013 | Ayazi et al. | 310/346 |

FOREIGN PATENT DOCUMENTS

| | | |
|---|---|---|
| JP | 2010-81303 A | 4/2010 |
| JP | 2011-187766 | 9/2011 |

OTHER PUBLICATIONS

John J. Hall "Electronic Effects in the Elastic Constants of n-Type Silicon", Physical Review vol. 161, No. 3, Sep. 15, 1967, pp. 756-761.

U.S. Appl. No. 13/965,654, filed Aug. 13, 2013, Abe et al.

Office Action issued on Jun. 24, 2014 in the corresponding Japanese Patent Application No. 2012-078261 (with English Translation).

Office Action issued on Sep. 16, 2014 in the corresponding Japanese Patent Application No. 2012-078261 (with English Translation).

* cited by examiner

SEMICONDUCTOR DEVICE WITH A RESONATOR USING ACOUSTIC STANDING WAVE EXCITED IN SEMICONDUCTOR CRYSTAL

CROSS-REFERENCE TO RELATED APPLICATION

This application is based upon and claims the benefit of priority from Japanese Patent Application No. 2012-078261, filed on Mar. 29, 2012, the entire contents of which are incorporated herein by reference.

FIELD

Embodiments described herein relate generally to a semiconductor device.

BACKGROUND

For generation of a reference frequency, a crystal oscillator is used in many cases. Although the crystal oscillator has a high Q factor and a high level of temperature stability of a resonance frequency, it is hard to integrate the crystal oscillator with a semiconductor integrated circuit. Meanwhile, a method for achieving high frequency accuracy comparable to that of the crystal oscillator without using the crystal oscillator is actively proposed.

For example, an oscillator using an electrostatic-type MEMS or a piezoelectric-type MEMS is proposed. Such the oscillator utilizes mechanical resonance or acoustic resonance, which is similar to the crystal oscillator in terms of operation principle. Moreover, such the oscillator is inherently more likely to achieve a high Q factor as compared with an LC resonator.

Even though integration of such a mechanical resonator or an acoustic resonator on a semiconductor substrate is possible in principle, it requires special material, structure, manufacturing process, implementation method and the like. Moreover, it is necessary to perform frequency tuning one by one due to variations in an oscillation frequency caused by manufacturing process variability. In this manner, there are many problems remained to be solved.

It is therefore desired to achieve a semiconductor device provided with an oscillator that is easy to be formed on a semiconductor substrate and has high frequency accuracy.

DETAILED DESCRIPTION

A semiconductor device according to an embodiment has: a semiconductor substrate; an acoustic resonator formed on the semiconductor substrate, having a semiconductor layer including one conduction type of impurity, the semiconductor layer is electrically isolated from the semiconductor substrate by a depletion layer, and configured to resonate at a predetermined resonance frequency based on acoustic standing wave excited in the semiconductor layer; a temperature detector formed on the semiconductor substrate and configured to detect temperature of the semiconductor substrate; a calculating unit formed on the semiconductor substrate and configured to perform calculation of temperature compensation based on the temperature detected by the temperature detector, kind of the impurity and concentration of the impurity; and a controller formed on the semiconductor substrate and configured to control the resonance frequency based on a result of the calculation by the calculating unit.

Inventors of the present application propose a method that excites acoustic standing wave in semiconductor crystal and uses it as a resonator to form an oscillator. The acoustic standing wave is excited by electric carrier collisions incorporated with phonon emission. In this case, the oscillator can be formed on a standard semiconductor substrate by a standard integrated circuit process, without using special material, special structure, special process, special implementation method and the like. Therefore, an oscillator having high frequency accuracy is expected to be provided at low cost by forming the oscillator by this method.

A resonance frequency of an acoustic resonator is determined by velocity of acoustic wave and a size of the resonator. In a case of a crystal oscillator, temperature dependence of a resonance frequency can be made extremely low by cutting out crystal having specific orientation.

However, the velocity of acoustic wave propagating in the semiconductor crystal is known to be isotropic with respect to crystal orientation but vary depending on kind and concentration of impurity added. Therefore, in order to achieve high frequency accuracy in the case of the resonator using the acoustic standing wave excited in the semiconductor crystal, correction for variation in the resonance frequency caused by variation in the impurity concentration needs to be performed in some way.

Moreover, manufacturing variation of the impurity concentration in semiconductor during a manufacturing process of an integrated circuit is inevitable to some extent. Therefore, a method for compensating the variation also is desired.

First Embodiment

A semiconductor device according to a first embodiment has: a semiconductor substrate; a first acoustic resonator formed on the semiconductor substrate, having a first semiconductor layer including one conduction type of impurity of first impurity concentration, the first semiconductor layer is electrically isolated from the semiconductor substrate by a depletion layer, and configured to resonate at a first resonance frequency based on acoustic standing wave excited in the first semiconductor layer; a first oscillator formed on the semiconductor substrate and configured to oscillate at a first oscillation frequency depending on the first resonance frequency; a second acoustic resonator formed on the semiconductor substrate, having a second semiconductor layer including the impurity of second impurity which is same kind as that of the first impurity, the second impurity has concentration different from the first impurity concentration, the second semiconductor layer is electrically isolated from the semiconductor substrate by a depletion layer, and configured to resonate at a second resonance frequency based on acoustic standing wave excited in the second semiconductor layer; a second oscillator formed on the semiconductor substrate and configured to oscillate at a second oscillation frequency depending on the second resonance frequency; a temperature detector formed on the semiconductor substrate and configured to detect temperature of the semiconductor substrate; a calculating unit formed on the semiconductor substrate and configured to perform calculation of temperature compensation based on the temperature detected by the temperature detector, kind of the impurity, the first impurity concentration, the second impurity concentration, the first oscillation frequency and the second oscillation frequency; and a controller configured to control the first oscillation frequency and the second oscillation frequency based on a result of the calculation by the calculating unit. The first and second semiconductor layers may include indirect band gap type semiconductor The semiconductor device according to the present embodiment excites acoustic standing wave in semiconductor crystal and uses it as a resonator. An oscillator is formed by using the resonator. Therefore, the semiconductor device provided with the oscillator on a semiconductor substrate can be formed on a standard semiconductor substrate by a standard integrated circuit process, without using special material, special structure, special process, special implementation method and the like. Moreover, a configuration that effectively corrects variation in the resonance frequency caused by variation in the impurity concentration can achieve high frequency accuracy.

Figure 1:
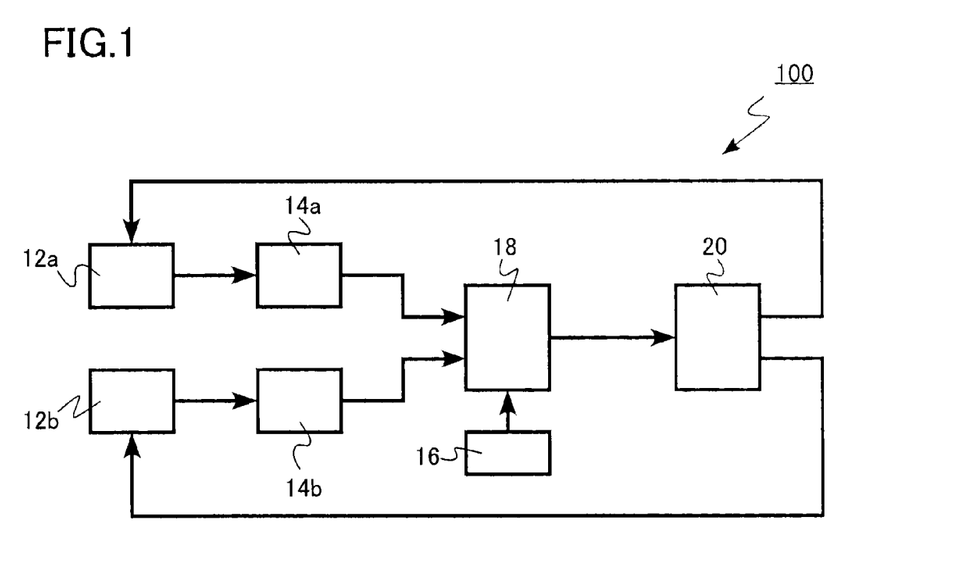
FIG. 1 is a block diagram showing a configuration of a semiconductor device according to a first embodiment.

FIG. 1 is a block diagram showing a configuration of a semiconductor device according to the present embodiment. A semiconductor device 100 according to the present embodiment is formed on a semiconductor substrate (e.g. silicon substrate). The semiconductor device 100 has a first acoustic resonator 12a. The first acoustic resonator 12a is formed on the semiconductor substrate, has a first semiconductor layer 22a including impurity of first impurity concentration $N_A$ and resonates at a first resonance frequency based on acoustic standing wave excited in the first semiconductor layer 22a. The semiconductor device 100 further has a first oscillator 14a. The first oscillator 14a is formed on the semiconductor substrate and oscillates at a first oscillation frequency $f_A$ depending on the first resonance frequency.

The semiconductor device 100 further has a second acoustic resonator 12b. The second acoustic resonator 12b is formed on the semiconductor substrate, has a second semiconductor layer 22b including impurity of second impurity concentration $N_B$ different from the first impurity concentration $N_A$ and resonates at a second resonance frequency based on acoustic standing wave excited in the second semiconductor layer 22b. Here, the impurity included in the second semiconductor layer 22b is the same kind as the impurity included in the first semiconductor layer 22a. The semiconductor device 100 further has a second oscillator 14b. The second oscillator 14b is formed on the semiconductor substrate and oscillates at a second oscillation frequency $f_B$ depending on the second resonance frequency.

The semiconductor device 100 further has a temperature detector 16 that is formed on the semiconductor substrate and detects temperature of the semiconductor substrate. The semiconductor device 100 further has a calculating unit 18. The calculating unit 18 is formed on the semiconductor substrate and performs calculation of temperature compensation based on the temperature detected by the temperature detector 16, the kind of the impurity included in the first and second semiconductor layers, the first impurity concentration, the second impurity concentration, the first oscillation frequency and the second oscillation frequency. The semiconductor device 100 further has a controller 20 that controls the first oscillation frequency and the second oscillation frequency based on a result of the calculation by the calculating unit 18.

Figure 2A:
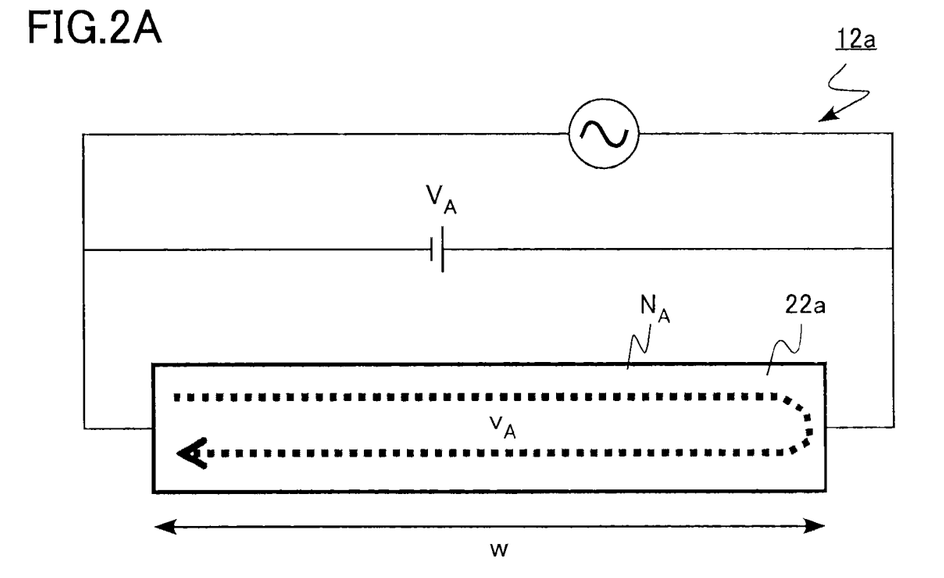
FIGS. 2A and 2B are explanatory diagrams of a resonator according to the first embodiment.
Figure 2B:
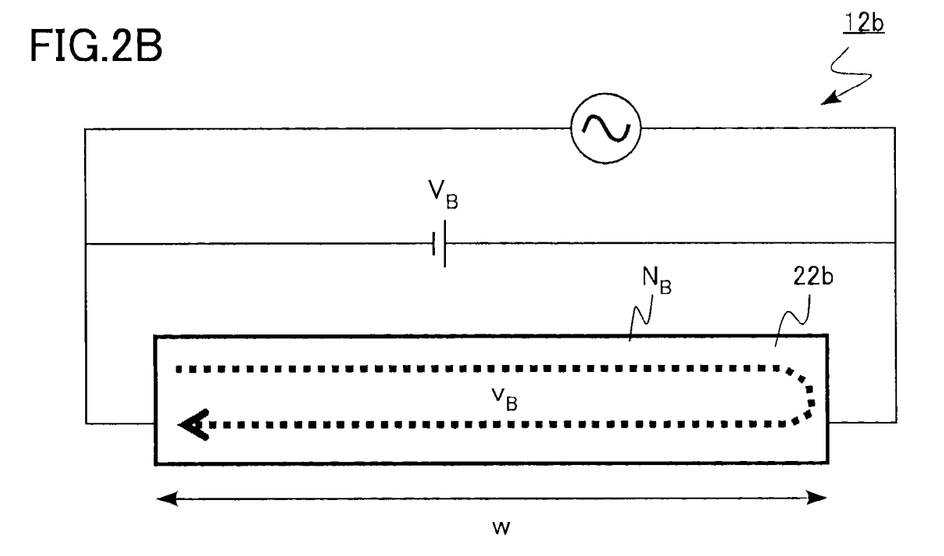

FIGS. 2A and 2B are explanatory diagrams of the resonator according to the present embodiment. The first acoustic resonator 12a has the first semiconductor layer 22a.

A width of the first semiconductor layer 22a is "w". The first semiconductor layer 22a includes impurity (e.g. boron (B)) whose concentration is the first impurity concentration $N_A$.

For example, when a pulse voltage is applied to both ends of the first semiconductor layer 22a, acoustic wave is generated due to a deformation potential effect of the semiconductor crystal. The acoustic wave propagates at acoustic velocity $v_A$ in the semiconductor crystal and thereby the acoustic standing wave is excited. Then, the first acoustic resonator 12a resonates at the first resonance frequency.

A width of the second semiconductor layer 22b is "w" that is the same as that of the first semiconductor layer 22a. Moreover, the second semiconductor layer 22b includes the same kind of impurity (e.g. boron (B)) as the first semiconductor layer 22a. The concentration of the impurity included in the second semiconductor layer 22b is the second impurity concentration $N_B$ different from the first impurity concentration $N_A$.

For example, when a pulse voltage is applied to both ends of the second semiconductor layer 22b, acoustic wave propagates at acoustic velocity $v_B$ in the semiconductor crystal and thereby the acoustic standing wave is excited. Then, the second acoustic resonator 12b resonates at the second resonance frequency.

Figure 3A:
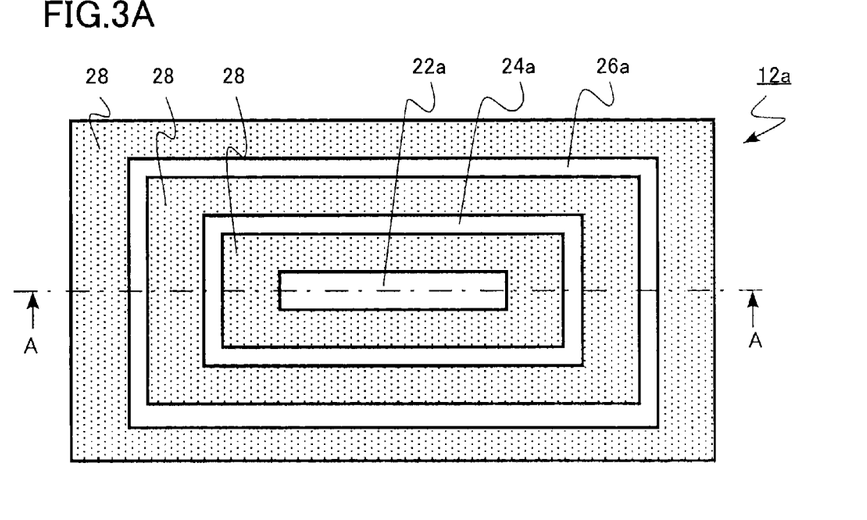
FIGS. 3A to 3C are schematic diagrams of the resonator according to the first embodiment.
Figure 3B:
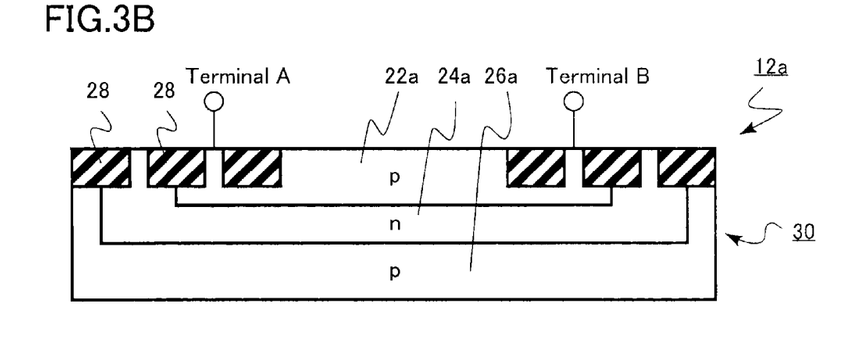
Figure 3C:
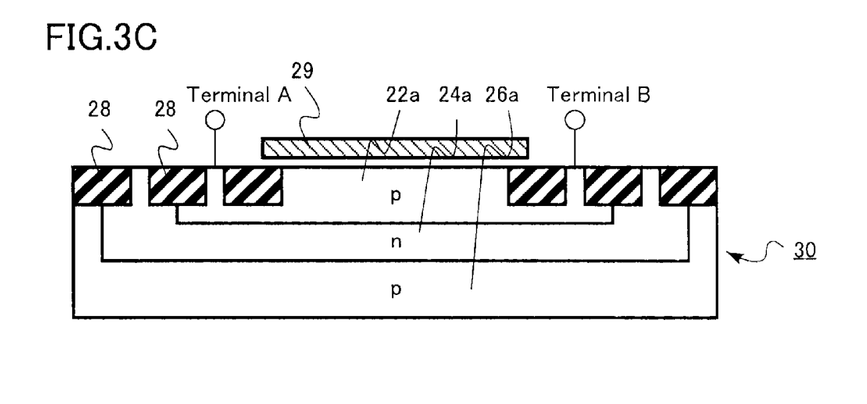

FIGS. 3A to 3C are schematic diagrams of the resonator according to the present embodiment. FIG. 3A is a plan view and FIG. 3B is a cross-sectional view taken along a line A-A in FIG. 3A. FIG. 3C is a schematic cross-sectional view of a modification example of the resonator. It should be noted that the first acoustic resonator 12a and the second acoustic resonator 12b has the same structure except for the impurity concentration in the semiconductor layer. Here, the first acoustic resonator 12a is described as an example.

For example, the first acoustic resonator 12a has a first p-type diffusion layer (the first semiconductor layer) 22a surrounded by a p-type substrate region 26a and an n-type well 24a formed in a semiconductor substrate 30. A device isolation structure 28 is formed at each boundary between the p-type substrate region 26a, the n-type well 24a and the first p-type diffusion layer 22a. The semiconductor substrate 30 is made of, for example, single crystal silicon (Si).

A terminal A and a terminal B are respectively formed on both ends of the first p-type diffusion layer 22a. When an alternating pulse voltage is applied between the terminal A and the terminal B, acoustic wave propagates in the first p-type diffusion layer 22a. In a case of a specific frequency, acoustic standing wave is excited due to coupling between charges in the semiconductor crystal and the acoustic wave, and thereby the first acoustic resonator 12a resonates at the first resonance frequency. The fact that the structure as shown in FIGS. 3A and 3B excites the acoustic standing wave and functions as the resonator has been confirmed by the inventors of the present application.

Moreover, in order to control the resonance frequency, a predetermined DC (direct-current) voltage $V_A$ is applied between the terminal A and the terminal B, for example. The velocity $v_A$ of the acoustic wave propagating in the semiconductor layer varies due to interaction between the acoustic wave and the charges that is caused by the application of the DC voltage $V_A$.

When the acoustic wave propagates in the semiconductor crystal, sparse and dense portions regarding electron density are generated at the same interval as a wavelength of the acoustic wave. When a DC electric field is applied in the same direction as the acoustic wave propagation direction under the condition that the sparse and dense portions regarding charge density exist, charges are accelerated by the electric field and thus drift velocity is increased.

When the drift velocity of the charges becomes higher than the propagation velocity of the acoustic wave under the condition of a sufficiently strong electric field, amplitude of the acoustic wave is gradually amplified and also the propagation velocity of the acoustic wave is increased. In this manner, the velocity of the acoustic wave can be changed by utilizing the interaction between acoustic phonon and electrons. Therefore, the resonance frequency of the acoustic standing wave excited in the first p-type diffusion layer 22a can be changed by changing the DC voltage $V_A$ applied between the terminal A and the terminal B.

It should be noted that a method of applying the DC voltage to the first semiconductor layer 22a is not limited to the above-described method that applies the DC voltage between the terminal A and the terminal B. For example, a method that utilizes a transistor or the like formed on the p-type diffusion layer 22a also is applicable. More specifically, as shown in FIG. 3C, a voltage is applied between a gate electrode 29 and an n-type diffusion layer (not shown) to change drift velocity of carriers (electrons, holes) running in a channel region of the transistor, which can change the velocity of the acoustic wave propagating in the channel region. In this case, change in a size of the channel region and an average charge density due to the applied gate voltage also contributes to the change in the velocity of the acoustic wave. Moreover, phonon that is generated when a part of the carriers (electrons, holes) running in the channel region of the transistor collides with the semiconductor crystal can be used as a generation source of the acoustic wave.

It is preferable that the first impurity concentration ($N_A$) and the second impurity concentration ($N_B$) both are not lower than $10^{17}$ atoms/cm$^3$ and not higher than $10^{20}$ atoms/cm$^3$. If the impurity concentration is lower than $10^{17}$ atoms/cm$^3$, the coupling between the charges and the acoustic wave in the semiconductor crystal becomes so weak that the acoustic standing wave hardly occurs. If the impurity concentration is higher than $10^{20}$ atoms/cm$^3$, the impurity may be precipitated beyond solid solubility limit.

It is preferable that difference between the first impurity concentration ($N_A$) and the second impurity concentration ($N_B$) is equal to or more than 1%. The reason is that if the difference is less than 1%, difference in the resonance frequency between the first acoustic resonator 12a and the second acoustic resonator 12b becomes so small that difference in the oscillation frequency between the first oscillator 14a and the second oscillator 14b can be hardly detected.

As to the first oscillator 14a and the second oscillator 14b, a publicly known oscillation circuit can be used for example. The first oscillator 14a and the second oscillator 14b are formed on the semiconductor substrate 30. For example, the first oscillator 14a and the second oscillator 14b each has elements such as transistors and capacitors formed on the semiconductor substrate 30.

The temperature detector 16 is formed on the semiconductor substrate. For example, a publicly known temperature detection element that can be formed on the semiconductor substrate can be used as the temperature detector 16.

The calculating unit 18 performs calculation for temperature compensation based on the temperature of the semiconductor substrate detected by the temperature detector 16, kind of the impurity included in the first semiconductor layer 22a and the second semiconductor layer 22b, the first impurity concentration $N_A$, the second impurity concentration $N_B$, the first oscillation frequency $f_A$ and the second oscillation frequency $f_B$.

For example, the calculating unit 18 has a difference calculating unit (not shown) that calculates difference between the first oscillation frequency $f_A$ and the second oscillation frequency $f_B$. The difference calculating unit calculates difference between the first oscillation frequency $f_A$ generated by the first oscillator 14a and the second oscillation frequency $f_B$ generated by the second oscillator 14b, namely $\Delta f = f_A - f_B$.

The calculating unit 18 also is formed on the semiconductor substrate 30. For example, the calculating unit 18 has elements such as transistors and capacitors formed on the semiconductor substrate 30.

The controller 20 controls the first oscillation frequency $f_A$ and the second oscillation frequency $f_B$ based on a result of the calculation by the calculating unit 18. More specifically, for example, the controller 20 generates a first DC voltage $V_A$ and a second DC voltage $V_B$ for performing the temperature compensation for the first resonance frequency of the first acoustic resonator 12a and the second resonance frequency of the second acoustic resonator 12b. Then, the controller 20 applies the first DC voltage $V_A$ and the second DC voltage $V_B$ to the first acoustic resonator 12a and the second acoustic resonator 12b, respectively. As a result, the first oscillation frequency $f_A$ and the second oscillation frequency $f_B$ for which the temperature compensation is performed can be obtained.

Next, operating principle of the semiconductor device according to the present embodiment will be described below in detail.

In a case where the acoustic standing wave is excited by using the acoustic wave propagating in the semiconductor crystal to form the resonator, the resonance frequency varies depending on temperature due to temperature dependence of a variety of semiconductor characteristics. Table 1 shows factors (parameters) for variation in the acoustic resonance frequency due to temperature variation and the associated temperature coefficients in a case where silicon (Si) is used as the semiconductor crystal as an example.

TABLE 1

| Parameter | Size w | Elastic constant $c_{11}$ | Mass m | Volume $d^3$ | Total |
|---|---|---|---|---|---|
| Coefficient | $-\dfrac{1}{w}\dfrac{\partial w}{\partial T}$ | $\dfrac{1}{2c_{11}}\dfrac{\partial c_{11}}{\partial T}$ | $\dfrac{1}{m}\dfrac{\partial m}{\partial T}$ | $\dfrac{3}{2d}\dfrac{\partial d}{\partial T}$ | — |
| Physical constant temperature coefficient (ppm/° C.) | 2.6 | −78.1 | 0 | 2.6 | — |
| Temperature coefficient parameter (ppm/° C.) | −2.6 | −39.05 | 0 | 3.9 | −37.75 |

As shown in Table 1, physical factors for the temperature variation of the resonance frequency can be classified into a coefficient of thermal expansion and temperature dependence of elastic constant. A dominant factor among them is the temperature variation of the elastic constant. Meanwhile, the elastic constant of the semiconductor crystal is known to vary depending on impurity doped in the semiconductor crystal.

Furthermore, not only a value of the elastic constant but also the associated temperature coefficient varies significantly. It is known that such the variation in the elastic constant depending on the impurity is not due to change in elastic characteristic of the semiconductor crystal but caused by mutual coupling between the charges generated by the impurity and the acoustic wave due to the deformation potential effect. Furthermore, difference ($\delta c_{11} = c_{11(PURE)} - c_{11(DOPED)}$) between the elastic constant ($c_{11(PURE)}$) of intrinsic semiconductor and the elastic constant ($c_{11(DOPED)}$) of extrinsic semiconductor is known to be expressed in theory by the following Expression (1) by using a deformation potential coefficient and charge density.

[Expression (1)]

$$\delta c_{11} = c_{11}(\text{pure}) - c_{11}(\text{doped}) \qquad (1)$$
$$= -\frac{2N\Xi_u^2}{9E_F}\left[\frac{\eta F'_{1/2}}{F_{1/2}(\eta)}\right]$$

$\Xi_u$: deformation potential N: charge density [Reference] J. J. Hall, Physical Review, Vol. 161, No. 3, (1967) pp. 756-761.

Figure 4:
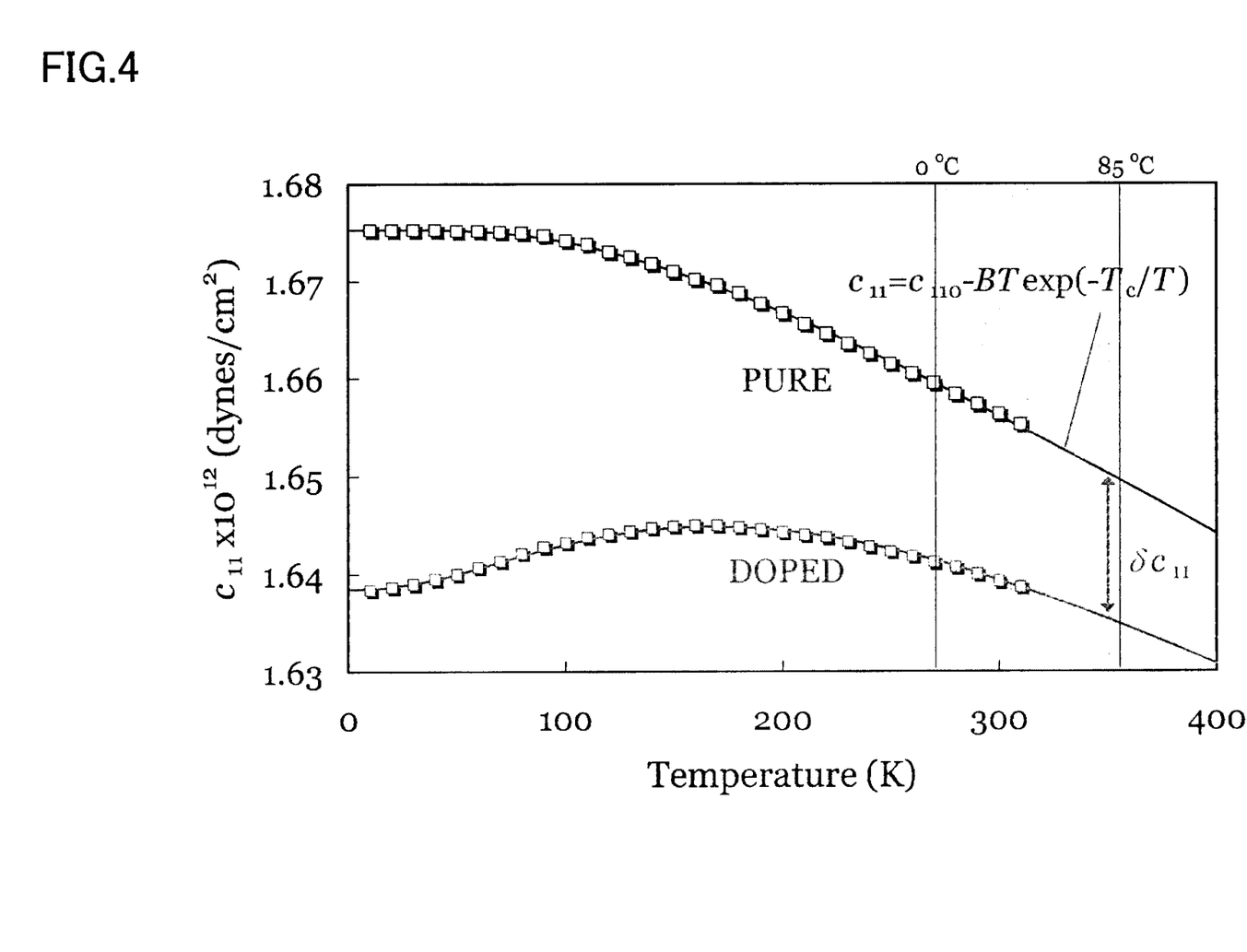
FIG. 4 is a diagram showing theoretical calculation and actual measured values regarding temperature dependence of elastic constant.

FIG. 4 is a diagram showing theoretical calculation and actual measured values regarding the temperature dependence of the elastic constant. Comparison between a result of the theoretical calculation by the use of the above-mentioned Expression (1) and actual measured values is shown. A solid line represents the actual measured values and square marks represent the theoretically calculated values.

In this calculation, the following parameters were used: Fermi level ($E_F$)=20.9 eV; deformation potential=8.6 eV; charge density (N)=1.94×10$^{19}$ cm$^{-3}$; and $\Delta c_{11}$ (T=0)=3.73 dyne/cm$^2$.

It can be seen from FIG. 4 that the theoretically calculated values are in excellent agreement with the actual measured values and therefore the values of the parameters used in the calculation are reasonable and theory and the theoretical expression as the basis of the calculation also are reasonable. The theory used here, namely, the assumption that the variation in the elastic constant of the semiconductor crystal due to the impurity amount is caused by the deformation potential effect and attributed to the interaction between the charges and the acoustic wave is considered to be reasonable.

When calculating the Expression (1) being the theoretical expression in a practical manner, it is necessary to calculate Fermi-Dirac's integral $F_{1/2}$ in brackets. It is known that the integral cannot be analytically calculated and numerical calculation must be performed by reference to a numerical table or by numerical calculation using a computer. Moreover, $F_{1/2}$ is a function that has very strong non-linearity with respect to temperature.

Therefore, the temperature dependence of the elastic constant of the semiconductor crystal including the impurity exhibits very strong non-linearity with respect to temperature. Therefore, simple compensation being proportional to temperature cannot necessarily achieve the temperature compensation with a high degree of accuracy.

According to the present embodiment, as shown in FIG. 1, the first acoustic resonator 12a, the second acoustic resonator 12b, the first oscillator 14a and the second oscillator 14b are used. The elastic constant of the first acoustic resonator 12a having the semiconductor layer including the impurity of the first impurity concentration $N_A$ is $c_{11A}$, and the elastic constant of the second acoustic resonator 12b having the semiconductor layer including the impurity of the second impurity concentration $N_B$ is $c_{11B}$. The elastic constant of intrinsic semiconductor including no impurity is $c_{11PURE}$. In this case, $c_{11A}$ and $c_{11B}$ are given by the following Expressions (2) and (3), respectively.

[Expression (2)]

$$c_{11A} = c_{11PURE} - \delta c_{11A} \qquad (2)$$

[Expression (3)]

$$c_{11B} = c_{11PURE} - \delta c_{11B} \qquad (3)$$

Here, $\delta c_{11A}$ and $\delta c_{11B}$ in the above Expressions (2) and (3) can be expressed by the following Expressions (4) and (5), respectively, based on the Expression (1), the first impurity concentration $N_A$ and the second impurity concentration $N_B$.

[Expression (4)]

$$\delta c_{11A} = -\frac{2N_A \Xi_u^2}{9E_F}\left[\frac{\eta F'_{1/2}}{F_{1/2}(\eta)}\right] \qquad (4)$$

[Expression (5)]

$$\delta c_{11B} = -\frac{2N_B \Xi_u^2}{9E_F}\left[\frac{\eta F'_{1/2}}{F_{1/2}(\eta)}\right] \qquad (5)$$

In the above-mentioned expressions, the Fermi energy $E_F$ is the same if the kind of impurity element is the same.

Moreover, the acoustic velocities $v_A$ and $v_B$ in the semiconductor crystal of the first acoustic resonator 12a and the second acoustic resonator 12b can be obtained by the following Expressions (6) and (7), respectively, based on the respective elastic constants $c_{11A}$ and $c_{11B}$ and density $\rho$.

[Expression (6)]

$$v_A = \sqrt{\frac{c_{11A}}{\rho}} \qquad (6)$$

[Expression (7)]

$$v_B = \sqrt{\frac{c_{11B}}{\rho}} \qquad (7)$$

Furthermore, the resonance frequencies $f_A$ and $f_B$ of the respective resonators can be obtained by the following Expressions (8) and (9), respectively, based on the respective acoustic velocities $v_A$ and $v_B$.

[Expression (8)]

$$f_A = \frac{v_A}{2w} \qquad (8)$$

[Expression (9)]

$$f_B = \frac{v_B}{2w} \qquad (9)$$

The difference $\Delta f$ between the resonance frequencies of the two resonators can be obtained by the following Expression (10), based on the above-mentioned expressions.

[Expression (10)]

$$\Delta f = f_A - f_B \qquad (10)$$
$$\cong \frac{f_{PURE}}{c_{11\,PURE}} \frac{(N_A - N_B)\Xi_u^2}{9E_F} \left[\frac{\eta F'_{\frac{1}{2}}}{F_{\frac{1}{2}}(\eta)}\right]$$

Here, $f_{PURE}$ is a resonance frequency expected from the elastic constant $c_{11PURE}$ in a case where the resonator is formed by using intrinsic semiconductor including no impurity. As is clearly seen from this definition, $f_{PURE}$ is independent of the impurity concentration.

[Expression (11)]

$$f_{PURE} = \frac{1}{2w}\sqrt{\frac{c_{11PURE}}{\rho}} \qquad (11)$$

It can be seen from comparison between the Expression (1) and the Expression (10) that the difference $\Delta f$ in the resonance frequency between the two resonators is proportional to the difference ($\delta c_{11} = c_{11(PURE)} - c_{11(DOPED)}$) between the elastic constant ($c_{11(PURE)}$) of intrinsic semiconductor and the elastic constant ($c_{11(DOPED)}$) of extrinsic semiconductor. Therefore, by controlling the first acoustic resonator 12a and the second acoustic resonator 12b such that the difference $\Delta f$ in the resonance frequency between the two resonators is always set to a constant value $\Delta f_0$, it is possible to obtain an oscillation frequency whose difference $\Delta f$ from the resonance frequency $f_{PURE}$ in the case where the resonator is formed by using intrinsic semiconductor is always constant. By controlling the first acoustic resonator 12a and the second acoustic resonator 12b with compensating for the temperature dependence of the resonance frequency $f_{PURE}$ in the case where the resonator is formed by using intrinsic semiconductor, it is possible to obtain a constant oscillation frequency independent of temperature.

Figure 5:
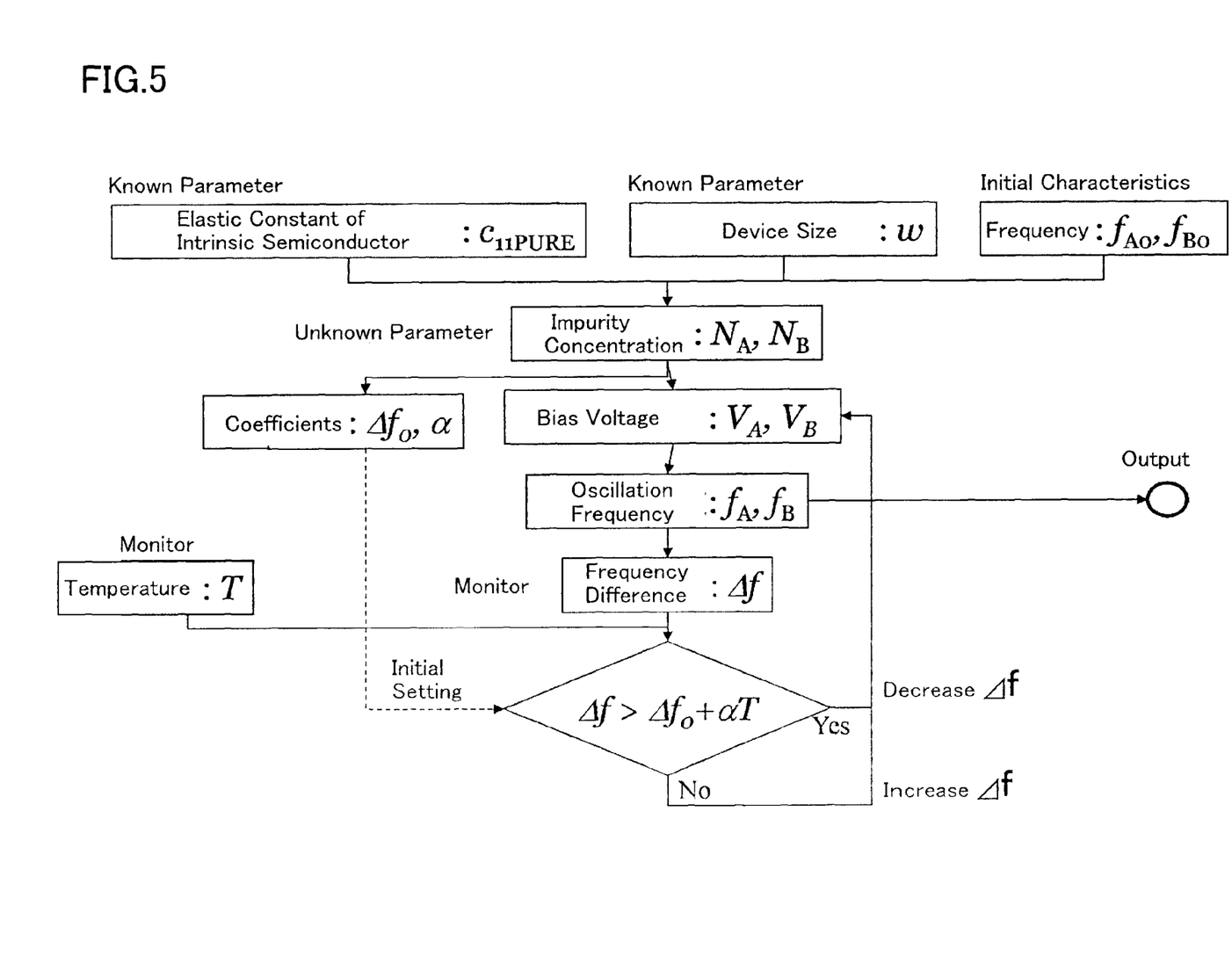
FIG. 5 is a flow chart of temperature compensation with respect to the semiconductor device according to the present embodiment.

FIG. 5 is a flow chart of the temperature compensation with respect to the semiconductor device according to the present embodiment and shows a control method in the semiconductor device according to the present embodiment.

We can assume that the elastic constant $c_{11PURE}$ of intrinsic semiconductor and a device size w (i.e. the width of the semiconductor layer) are known parameters. On the other hand, the first impurity concentration $N_A$ regarding the first acoustic resonator and the second impurity concentration $N_B$ regarding the second acoustic resonator are unknown parameters when variation due to the manufacturing process variability are taken into consideration. However, the first impurity concentration $N_A$ and the second impurity concentration $N_B$ can be roughly estimated from a measurement result of oscillation frequencies $f_{A0}$ and $f_{B0}$ being initial characteristics of the first oscillator 14a and the second oscillator 14b, respectively.

Coefficients $\Delta f_0$ and a necessary for controlling the first acoustic resonator 12a and the second acoustic resonator 12b and initial DC bias voltages $V_{A0}$ and $V_{B0}$ applied to the resonators can be determined from the results.

As a result of actual oscillation operation, the first oscillation frequency $f_A$ and the second oscillation frequency $f_B$ are obtained from the first oscillator 14a and the second oscillator 14b, respectively. Furthermore, the difference $\Delta f$ between the first oscillation frequency $f_A$ and the second oscillation frequency $f_B$ is calculated by the calculating unit 18.

Separately, environmental temperature T is monitored by the temperature detector 16. Then, the calculating unit 18 compares the difference $\Delta f$ regarding the oscillation frequencies with $\Delta f_0 + \alpha T$. In a case of a relationship $\Delta f > \Delta f_0 + \alpha T$ as a result of the comparison, the controller 20 controls the bias voltages $V_A$ and $V_B$ so as to decrease $\Delta f$.

On the other hand, in a case of a relationship $\Delta f < \Delta f_0 + \alpha T$ as a result of the comparison by the calculating unit 18, the controller 20 controls the bias voltages $V_A$ and $V_B$ so as to increase $\Delta f$.

As a result of such the feedback, a relationship $\Delta f = \Delta f_0 + \Delta T$ can be obtained at a steady state. Furthermore, it is preferable to control the first acoustic resonator 12a and the second acoustic resonator 12b with compensating for the temperature dependence of the resonance frequency $f_{PURE}$ in the case where the resonator is formed by using intrinsic semiconductor. In this case, a constant oscillation frequency independent of temperature can be obtained by the first oscillator 14a and the second oscillator 14b.

As compared with a case where such the controlling is not performed, variations in the oscillation frequencies $f_A$ and $f_B$ with respect to the environment temperature T can be greatly suppressed. That is, it is possible to achieve the first oscillator 14a and the second oscillator 14b where variation in the oscillation frequency with respect to the temperature variation is small and thus the frequency accuracy is significantly improved.

Table 2 shows estimation of effects of the present embodiment. Regarding the effects of the present embodiment, frequency accuracy is estimated under the following assumption: (1) impurity concentration variation=±10% and (2) DC bias voltage controlling error=±0.1 mV. For comparison, a case where no temperature compensation is performed (first comparative example) and a case where only the linear temperature compensation is performed (second comparative example) also are shown in Table 2.

TABLE 2

|  | First comparative example | Second comparative example | Embodiment |
|---|---|---|---|
| Temperature compensation | No | Linear temperature compensation | Non-linear temperature compensation |
| Impurity concentration compensation | No | Bias voltage | Two oscillators |
| Frequency error @RT | ±250 ppm | ±20 ppm | ±20 ppm |
| Temperature variation −25~75° C. | ±1000 ppm | ±250 ppm | ±100 ppm |

As described above, the frequency accuracy of the oscillator can be improved by the semiconductor device provided with the temperature compensation function according to the present embodiment.

Second Embodiment

A semiconductor device according to a second embodiment has: a semiconductor substrate; an acoustic resonator formed on the semiconductor substrate, having a semiconductor layer including impurity and configured to resonate at a predetermined resonance frequency based on acoustic standing wave excited in the semiconductor layer; an oscillator formed on the semiconductor substrate and configured to oscillate at an oscillation frequency depending on the resonance frequency; a temperature detector formed on the semiconductor substrate and configured to detect temperature of the semiconductor substrate; a calculating unit formed on the semiconductor substrate and configured to perform calculation of temperature compensation based on the temperature detected by the temperature detector, kind of the impurity, concentration of the impurity and the oscillation frequency of the oscillator; a memory unit formed on the semiconductor substrate and configured to store information used in the calculation; and a controller formed on the semiconductor substrate and configured to control the resonance frequency based on a result of the calculation by the calculating unit.

According to the present embodiment, the memory unit formed on the semiconductor substrate and configured to store information used in the calculation is provided to facilitate the calculation of the temperature compensation. Moreover, not a plurality of resonators but only one resonator is provided. The present embodiment is different from the first embodiment particularly in the above-mentioned two points. An overlapping description with the first embodiment will be omitted hereinafter.

Figure 6:
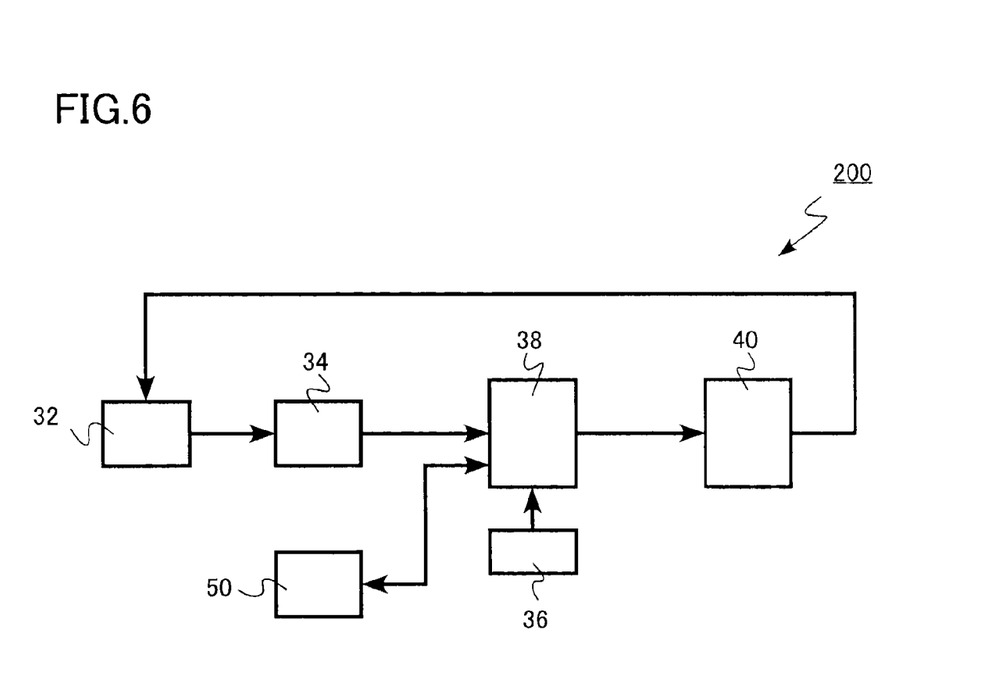
FIG. 6 is a block diagram showing a configuration of a semiconductor device according to a second embodiment.

FIG. 6 is a block diagram showing a configuration of a semiconductor device according to the present embodiment. A semiconductor device 200 according to the present embodiment is formed on a semiconductor substrate (e.g. silicon substrate). The semiconductor device 200 has an acoustic resonator 32. The acoustic resonator 32 is formed on the semiconductor substrate, has a semiconductor layer including impurity and resonates at a predetermined resonance frequency based on acoustic standing wave excited in the semiconductor layer. The semiconductor device 200 further has an oscillator 34. The oscillator 34 is formed on the semiconductor substrate and oscillates at an oscillation frequency f depending on the above-mentioned resonance frequency.

The semiconductor device 200 further has a temperature detector 36 that is formed on the semiconductor substrate and detects temperature of the semiconductor substrate. The semiconductor device 200 further has a calculating unit 38. The calculating unit 38 is formed on the semiconductor substrate and performs calculation of temperature compensation based on the temperature detected by the temperature detector 36, kind and concentration of the impurity included in the semiconductor layer and the oscillation frequency of the above-mentioned oscillator. The semiconductor device 200 further has a memory unit 50. The memory unit 50 is formed on the semiconductor substrate and stores information used in the calculation. The semiconductor device 200 further has a controller 40 that controls the oscillation frequency of the above-mentioned oscillator based on a result of the calculation by the calculating unit 38.

The memory unit 50 is, for example, a non-volatile memory unit formed on the semiconductor substrate. For example, information depending on the kind and concentration of the impurity included in a semiconductor crystal region (i.e. semiconductor layer) of the resonator 32 in which the acoustic standing wave is excited is stored in the memory unit 50. The calculating unit 38 performs the calculation of the temperature compensation based on the information stored in the memory unit 50.

Next, operating principle of the semiconductor device according to the present embodiment will be described below in detail.

As described in Table 1, the physical factors for the temperature variation of the resonance frequency can be classified into the coefficient of thermal expansion and the temperature dependence of the elastic constant. A dominant factor among them is the temperature variation of the elastic constant. In a case of intrinsic semiconductor including no impurity, the temperature dependence of the elastic constant can be approximated by using the following Expression (12) with a high degree of accuracy.

[Expression (12)]

$$c_{11} = c_{110} - BT \exp\left(-\frac{T_c}{T}\right) \tag{12}$$

By appropriately setting values of coefficients $c_{110}$, $\beta$ and $T_0$ used in the actual calculation, it is possible to obtain a calculation result that is in good agreement with the actual measured values of the temperature dependence regarding the elastic constant $c_{11}$ of intrinsic semiconductor, as indicated by "PURE" in FIG. 4. The values of the coefficients $c_{110}$, $\beta$ and $T_0$ depend on kind of semiconductor. The following values are used in the calculation.

[Expression (13)]

$c_{110} = 1.6753 \times 10^{12} (\text{dyne/cm}^2)$ $B = 1.424 \times 10^{-4}$ $T_c = 241.082 (\text{K}) \tag{13}$ Meanwhile, the difference ($\delta c_{11} = c_{11(PURE)} - c_{11(DOPED)}$) between the elastic constant ($c_{11(PURE)}$) of intrinsic semiconductor and the elastic constant ($c_{11(DOPED)}$) of extrinsic semiconductor is known to be expressed in theory by the above-mentioned Expression (1). By using Expressions (1) and (12), it is possible to obtain a calculation result that is in good agreement with the actual measured values of the temperature dependence regarding the elastic constant $c_{11}$ of extrinsic semiconductor, as indicated by "DOPED" in FIG. 4.

The deformation potential coefficient in the above-mentioned Expression (1) also depends on kind of semiconductor. In a case of silicon (Si), the deformation potential coefficient is known to be 8.6 eV. The Fermi energy $E_F$ depends on the kind of impurity.

Regarding the impurity concentration N, the manufacturing process variability needs to be taken into consideration. However, the impurity concentration N can be estimated from a measurement result of an oscillation frequency $f_0$ being an initial characteristic of the oscillator 34. In the present embodiment, the estimated value is used as the value of the impurity concentration N.

According to the present embodiment, information of coefficients necessary for the calculation of Expressions (1) and (12), namely, information of coefficients depending on the kind and concentration of the impurity and the kind of semiconductor is stored in the memory unit 50. Then, the calculating unit 38 performs the calculation of the temperature compensation by using the temperature T detected by the temperature detector 36 and the coefficients read out from the memory unit 50.

Then, the controller 40 controls the oscillation frequency of the above-mentioned oscillator 34 based on a result of the calculation by the calculating unit 38. For example, the controller 40 varies the DC bias voltage V applied to the resonator 32 to compensate for the temperature dependence of the oscillation frequency f of the oscillator 34.

It should be noted that the portion of Fermi-Dirac's integral in Expression (1) has strong non-linearity with respect to the temperature T and calculating it by the calculating unit 38 is complicated. Therefore, the portion of Fermi-Dirac's integral may be beforehand calculated, the calculation result may be stored in the memory unit 50 and the calculation result may be read out from the memory unit 50, as needed, for use in the calculation by the calculating unit 38. In this case, processing in the calculating unit 38 is simplified.

In the above-described embodiments, the material of the semiconductor substrate and the semiconductor layer is silicon (Si) for example. However, the semiconductor material is not limited to silicon (Si). Single element semiconductor such as germanium (Ge) or compound semiconductor such as silicon carbide (SiC), gallium nitride (GaN) and gallium arsenide (GaAs) also is applicable. In the above-described embodiments, temperature calibration on elastic coefficient of c11 is described as an example. However, application of the above-described calibration method is not limited to c11. The same calibration method can be applied to the other elastic coefficients like c12 or c44

In the above-described embodiments, the semiconductor device having the oscillator is described as an example. Moreover, the embodiments can be applied also to a semiconductor device having an analog/digital integrated circuit such as a frequency filter, a wide variety of mechanical sensor, an antenna, a matching circuit and an amplifier circuit which uses the acoustic resonator.

While certain embodiments have been described, these embodiments have been presented by way of example only, and are not intended to limit the scope of the inventions. Indeed, a semiconductor device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
a first conductive type semiconductor substrate;
an acoustic resonator formed on the semiconductor substrate, the acoustic resonator comprising a first conductive type semiconductor layer including first conductive type impurity, the semiconductor layer is electrically isolated from the semiconductor substrate by a second conductive type semiconductor well region both in direction vertical to a surface of the semiconductor layer and in direction parallel to the surface of the semiconductor layer, the semiconductor layer being surrounded by the semiconductor well region at the surface of the semiconductor layer, a device isolation structure surrounding the semiconductor layer forms a boundary between the semiconductor layer and the semiconductor well region at the surface of the semiconductor layer, the acoustic resonator resonates at a resonance frequency based on acoustic standing wave excited in the semiconductor layer, the semiconductor substrate, the semiconductor layer and the semiconductor well region are formed in a same single crystal;
at least one electric terminal provided directly on the surface of the semiconductor layer;
a temperature detector formed on the semiconductor substrate, the temperature detector detects temperature of the semiconductor substrate;
a calculating unit formed on the semiconductor substrate, the calculating unit performs calculation of temperature compensation based on the temperature detected by the temperature detector, kind of the impurity and concentration of the impurity; and
a controller formed on the semiconductor substrate, the controller controls the resonance frequency based on a result of the calculation by the calculating unit.

2. The device according to claim 1,
wherein the acoustic standing wave is excited by application of a pulse voltage to the semiconductor layer incorporated with deformation potential effect.

3. The device according to claim 1,
wherein the same single crystal is silicon.

4. The device according to claim 1,
wherein the acoustic standing wave is excited by electric carrier collisions incorporated with phonon emission.

5. A semiconductor device comprising:
a first conductive type semiconductor substrate;
a first acoustic resonator formed on the semiconductor substrate, the first acoustic resonator comprising a first conductive type first semiconductor layer including first conductive type first impurity concentration, the first semiconductor layer is electrically isolated from the semiconductor substrate by a second conductive type first semiconductor well region both in direction vertical to a surface of the first semiconductor layer and in direction parallel to the surface of the first semiconductor layer, the first semiconductor layer being surrounded by the first semiconductor well region at the surface of the first semiconductor layer, a first device isolation structure surrounding the first semiconductor layer forms a first boundary between the first semiconductor layer and the first semiconductor well region at the surface of the first semiconductor layer, the first acoustic resonator resonates at a first resonance frequency based on acoustic standing wave excited in the first semiconductor layer, the semiconductor substrate, the first semiconductor layer and the first semiconductor well region are formed in a same single crystal;
at least one electric terminal provided directly on the surface of the first semiconductor layer;
a first oscillator formed on the semiconductor substrate, the first oscillator oscillates at a first oscillation frequency depending on the first resonance frequency;
a second acoustic resonator formed on the semiconductor substrate, the second acoustic resonator comprising a first conductive type second semiconductor layer including first conductive type second impurity, the second impurity has concentration different from the first impurity concentration, the second semiconductor layer is electrically isolated from the semiconductor substrate by a second conductive type second semiconductor well region both in direction vertical to a surface of the second semiconductor layer and in direction parallel to the surface of the second semiconductor layer, the second semiconductor layer being surrounded by the second semiconductor well region at the surface of the second semiconductor layer, a second device isolation structure surrounding the second semiconductor layer forms a second boundary between the second semiconductor layer and the second semiconductor well region at the surface of the second semiconductor layer, the second acoustic resonator resonates at a second resonance frequency based on acoustic standing wave excited in the second semiconductor layer, the semiconductor substrate, the second semiconductor layer and the second semiconductor well region are formed in the same single crystal;

at least one electric terminal provided directly on the surface of the second semiconductor layer;

a second oscillator formed on the semiconductor substrate, the second oscillator oscillates at a second oscillation frequency depending on the second resonance frequency;

a temperature detector formed on the semiconductor substrate, the temperature detector detects temperature of the semiconductor substrate;

a calculating unit formed on the semiconductor substrate, the calculating unit performs calculation of temperature compensation based on the temperature detected by the temperature detector, kind of the impurity, the first impurity concentration, the second impurity concentration, the first oscillation frequency and the second oscillation frequency; and a controller formed on the semiconductor substrate, the controller controls the first oscillation frequency and the second oscillation frequency based on a result of the calculation by the calculating unit.

6. The device according to claim 5,
wherein the calculating unit comprises a difference calculating unit calculates difference between the first oscillation frequency and the second oscillation frequency.

7. The device according to claim 5,
wherein the controller generates a first direct-current voltage applied to the first semiconductor layer and a second direct-current voltage applied to the second semiconductor layer.

8. The device according to claim 5,
wherein the acoustic standing wave is excited by application of respective pulse voltages to the first semiconductor layer and the second semiconductor layer, the first and second semiconductor layers include indirect band gap type semiconductor.

9. The device according to claim 5,
wherein the same single crystal is silicon.

10. The device according to claim 5,
the acoustic standing wave is excited by electric carrier collision incorporated with phonon emission.

11. The device according to claim 5,
wherein the first impurity concentration and the second impurity concentration both are not lower than $10^{17}$ atoms/cm$^3$ and not higher than $10^{20}$ atoms/cm$^3$.

12. The device according to claim 5,
wherein difference between the first impurity concentration and the second impurity concentration is equal to or more than 1%.

13. A semiconductor device comprising:
a first conductive type semiconductor substrate;
an acoustic resonator formed on the semiconductor substrate, the acoustic resonator comprising a first conductive type semiconductor layer including first conductive type impurity, the semiconductor layer is electrically isolated from the semiconductor substrate by a second conductive type semiconductor well region both in direction vertical to a surface of the semiconductor layer and in direction parallel to the surface of the semiconductor layer, the semiconductor layer being surrounded by the semiconductor well region at the surface of the semiconductor layer, a device isolation structure surrounding the semiconductor layer forms a boundary between the semiconductor layer and the semiconductor well region at the surface of the semiconductor layer, the acoustic resonator resonates at a predetermined resonance frequency based on acoustic standing wave excited in the semiconductor layer, the semiconductor substrate, the semiconductor layer and the semiconductor well region are formed in a same single crystal;

at least one electric terminal provided directly on the surface of the semiconductor layer;

an oscillator formed on the semiconductor substrate, the oscillator oscillates at an oscillation frequency depending on the resonance frequency;

a temperature detector formed on the semiconductor substrate, the temperature detector detects temperature of the semiconductor substrate;

a calculating unit formed on the semiconductor substrate, the calculating unit performs calculation of temperature compensation based on the temperature detected by the temperature detector, kind of the impurity, concentration of the impurity and the oscillation frequency of the oscillator;

a memory unit formed on the semiconductor substrate, the memory unit stores information used in the calculation; and a controller formed on the semiconductor substrate, the controller controls the resonance frequency based on a result of the calculation by the calculating unit.

14. The device according to claim 13,
wherein the information includes a coefficient of an expression used in the calculation.

15. The device according to claim 13,
wherein the controller generates a direct-current voltage applied to the semiconductor layer.

16. The device according to claim 13,
wherein the same single crystal is silicon.

17. The device according to claim 13,
wherein the acoustic standing wave is excited by electric carrier collisions incorporated with phonon emission.

* * * * *